United States Patent
Kotowski et al.

[11] Patent Number: 5,111,353
[45] Date of Patent: May 5, 1992

[54] OVERVOLTAGE PROTECTION CIRCUIT

[75] Inventors: Jeffrey P. Kotowski, Rolling Meadows; Brian Chapman, Gurnee, both of Ill.

[73] Assignee: Motorola, Inc., Schaumburg, Ill.

[21] Appl. No.: 520,299

[22] Filed: May 7, 1990

[51] Int. Cl.⁵ .................... G05B 9/02; F02D 41/30
[52] U.S. Cl. .................... 361/91; 361/160; 361/166; 361/170
[58] Field of Search .............. 361/91, 154, 155, 156, 361/167, 187, 74, 160

[56] References Cited

U.S. PATENT DOCUMENTS

| | | | |
|---|---|---|---|
| 3,185,916 | 5/1965 | Brewster | 322/28 |
| 3,579,039 | 5/1971 | Damon | 361/74 |
| 4,449,158 | 5/1984 | Taira | 361/91 |
| 4,618,908 | 10/1986 | Anttila | 361/187 |
| 4,736,145 | 4/1988 | Sakurai et al. | 361/187 |

OTHER PUBLICATIONS

SGS-Thomson Microelectronics L530, pp. 71-78, May, 1989.
SGS-Thomson Microelectronics VB020, pp. 85-89, Jun., 1989.

Primary Examiner—A. D. Pellinen
Assistant Examiner—S. Jackson
Attorney, Agent, or Firm—Phillip H. Melamed

[57] ABSTRACT

Overvoltage protection circuit (10) has a power transistor (11) that drives an inductive load (19). A resistor (16) is connected between an output electrode (14) of the transistor and a control electrode (12) of the transistor, and a constant current source (18) is also connected to the control electrode. The resistor and constant current source determine an effective zener voltage to limit the maximum voltage which can exist at the transistor output electrode (14), and this is accomplished without the use of a zener diode while utilizing a minimum number of components. This effective zener diode voltage can be readily adjusted by adjusting either the magnitude of the resistor (16) or the constant current source (18).

28 Claims, 1 Drawing Sheet 5,111,353

OVERVOLTAGE PROTECTION CIRCUIT

FIELD OF THE INVENTION

The present invention relates generally to the field of overvoltage protection circuits. More particularly, the present invention relates to the field of overvoltage protection circuits which can prevent device damage due to transient inductive flyback voltages.

BACKGROUND OF THE INVENTION

For circuits which drive substantial inductive loads, such as fuel injector solenoids or ignition coils, typically some sort of inductive flyback protection circuit is required to prevent damage to the driver circuitry by large inductive flyback voltages. Such flyback circuitry limits the magnitude of the flyback voltages and also assists in dissipating the flyback energy to ensure proper rapid deactivation of an inductance.

Typically a zener diode has been utilized to limit flyback voltage and thereby protect the inductive load driver stage. U.S. Pat. No. 4,618,908 to Anttila illustrates one such zener diode protection circuit in which a zener diode in series with a resistor is connected between the collector of a Darlington driver stage and its base electrode. This configuration enables the use of a low power zener diode, but stills requires the use of a relatively expensive zener diode and resistor both of which are typically provided external to integrated circuit (IC) driver circuitry used to control the operative state of the Darlington driver stage. The zener diode and resistor typically have to be able to withstand high voltage transients at least for a short duration of time. Thus both components are generally discrete components provided external to a control IC. Also, such a configuration relies on the zener diode breakdown voltage for determining the maximum voltage which will be permitted to exist at the collector of the Darlington stage due to inductive flyback transient voltages. Zener diode voltages are only available in several discrete voltage values. Also, since these zener voltages cannot be very accurately controlled from device to device, this leads to a substantial variation in controlling the flyback voltage limit for different inductors. This may result in undesirable inherent unequal operation when such circuitry is used in conjunction with a plurality of inductive loads, such as the solenoid coils for a plurality of fuel injectors used in an engine.

Some circuits have utilized a resistor divider in conjunction with a zener diode to form a feedback path between the output collector of a power driver device and its base so as to form an overvoltage protection circuit to prevent excessive voltages from existing at the output electrode of the driver device. Sometimes the voltage divider is provided inside an integrated circuit which also includes the zener diode. However, in this configuration the maximum voltage which might be applied to the driver output terminal cannot be accurately controlled since it is a function of the zener diode breakdown voltage and it is known that there is a substantial tolerance with regard to the breakdown voltage of zener diodes. Other circuits have apparently utilized two external resistors in a voltage divider configuration while utilizing a zener diode inside an integrated circuit control circuit to accomplish a similar end result. This results in the use of two resistors external to the integrated circuit and therefore increases the parts count and cost of such a circuit. In addition, in such prior circuits there is still no way to have the integrated circuit itself adjust the maximum voltage level for voltages applied to the output electrode of the driver stage. This is the voltage level which can exist prior to the zener diode breaking down and providing a measure of protection for limiting the voltage applied to the driver stage.

OBJECTS OF THE INVENTION

An object of the present invention is to provide an improved overvoltage protection circuit which overcomes the aforementioned deficiencies of prior overvoltage protection circuits.

An additional object of the present invention is to provide an improved overvoltage protection circuit in which the maximum voltage level is readily adjustable.

Another object of the present invention is to provide an improved overvoltage protection circuit which utilizes a minimum number of components and/or is useable for limiting inductive flyback voltages which may damage driver stages for inductive loads.

A further object of the present invention is to provide an improved overvoltage protection circuit which does not utilize a zener diode and therefore is not subject to tolerance variations normally associated with the breakdown voltages of such components.

BRIEF DESCRIPTION OF THE DRAWINGS

For a more complete understanding of the present invention, reference should be made to the drawings in which.

DESCRIPTION OF THE PREFERRED EMBODIMENTS

Figure 1:
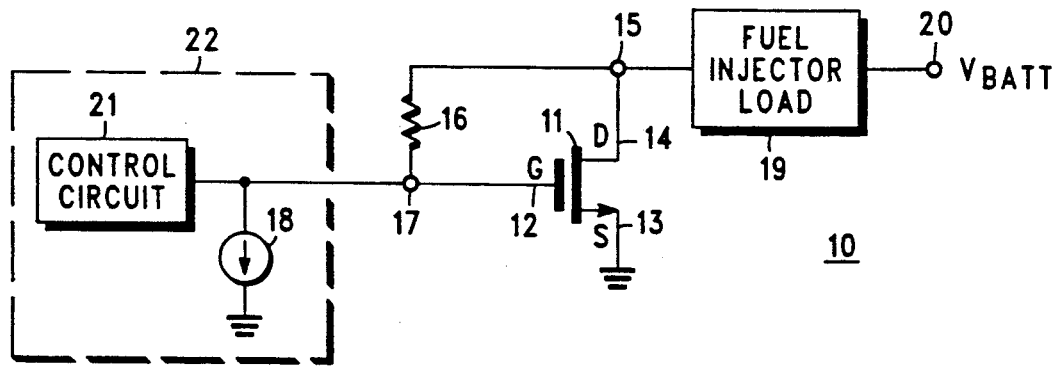
FIG. 1 is a schematic diagram of an embodiment of the present invention.

Referring to FIG. 1, an overvoltage protection circuit 10 is illustrated. The circuit includes a power driver or switching transistor 11. In FIG. 1 transistor 11 is illustrated as a field effect transistor (FET) having a control or gate electrode 12 and a pair of first and second output electrodes 13 and 14 corresponding to source and drain electrodes, respectively.

The source electrode 13 is directly connected to a fixed reference potential, ground potential, and the drain electrode 14 is directly connected to, and therefore DC coupled to, a terminal 15 at which a variable voltage signal is provided thereat. The FET 11 is turned on and thereby permits current conduction between the drain and source electrodes in response to the gate electrode receiving a control signal voltage thereat which exceeds a predetermined threshold voltage with respect to the source electrode 13. Thus when a sufficient voltage is provided at the gate electrode with respect to the voltage at the source electrode, the FET will be turned on.

A resistor 16 is connected between the terminal 15 and a terminal 17 which is directly connected to the gate electrode 12. In addition, a constant current source 18 is directly connected between the terminal 17 and ground potential wherein the constant current source provides a known current. A fuel injector inductive load 19 is connected between the terminal 15 and a power supply terminal 20 at which a DC power supply voltage $V_{BATT}$ is provided by a battery (not shown). A control Circuit 21 provides an external Switch control signal as an output to the terminal 17 wherein this external switch control signal is in addition to any signals provided by the resistor 16 or constant current source 18. The external control signal provided by the control circuit 21 controls the turning on and off of the FET 11 in accordance with the magnitude of this signal. The constant current source 18 and control circuit 21 are preferably on an integrated circuit 22 shown dashed in FIG. 1. The operation of the overvoltage protection circuit 10 is as follows:

When the control circuit 21 desires to turn on the FET 11, it provides a substantial positive voltage at the terminal 17 which corresponds to an output terminal of the integrated circuit 22. This voltage is in excess of the FET gate-to-source threshold turn on voltage and thus results in turning on the FET 11. This results in current flowing through the drain and source terminals causing current to flow through the fuel injector inductive load 19 between the power supply terminal 20 and the terminal 15. When the control circuit 21 desires to turn off the FET 11, it provides an open circuit high impedance state for its external control signal provided at the terminal 17. This results in the FET 11 starting to turn off. As the FET 11 turns off, a very high voltage transient signal will be provided at the terminal 15 due to the inductive flyback action of the load 19. If overvoltage protection were not provided, this large inductive signal could readily damage the FET 11. However, the present invention prevents this in the following manner.

At the commencement of the inductive flyback voltage, the voltage at the terminal 15 will increase. The resistor 16 will provide current to terminal 17 in accordance with the magnitude of the voltage at terminal 15. When the voltage at terminal 15 reaches a maximum predetermined voltage, the resistor 16 will conduct a sufficient current from the terminal 15 to the terminal 17 which current will exceed the known current provided by constant current source 18 by a predetermined amount. This excessive current has nowhere else to go except into the gate electrode of the FET 11. This will result in this excess current causing the voltage at the gate to increase and the FET 11 to turn on and permit current conduction between its drain and source terminal. The result is the providing of a low impedance path to ground for the terminal 15 which results in rapid dissipation of the inductive flyback energy and limits the maximum voltage which can occur at the terminal 15.

It can be seen that the circuit configuration of the present invention ensures that the voltage at the terminal 15 due to inductive flyback action will not exceed a maximum voltage approximately equal to the magnitude of the resistor 16 times the current of the constant current source 18 plus the gate-to-source threshold voltage of the FET 11. Essentially, the maximum voltage at terminal 15 is when this voltage is sufficiently above the gate to source turn on threshold voltage such that the resistor 16 provides a current to terminal 17 which exceeds the known current of the current source 18.

Thus the circuit 10 has essentially implemented an effective zener diode regulation for the voltage at the terminal 15, but this has now been achieved without the utilization of a zener diode. Therefore the maximum voltage at terminal 15 is not subject to tolerance variations normally associated with zener diodes since there is no zener diode which is utilized. In addition, the maximum voltage for the terminal 15 can be readily adjusted by adjusting or selecting either the magnitude of the resistor 16 or the magnitude of the current of the constant current source 18. Thus regulation of the maximum voltage at the terminal 15 is achieved by the utilization of only two components, the resistor 16 and the constant current source 18, with only one of these components being preferably provided external to the integrated circuit 22.

Figure 2:
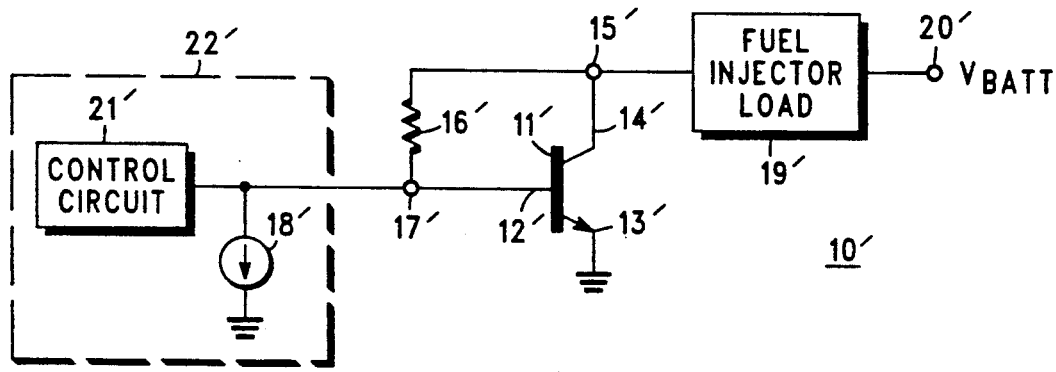
FIG. 2 is a schematic diagram of another embodiment of the present invention.

Referring to FIG. 2, an almost identical circuit configuration is illustrated except that the transistor 11 is now illustrated as a bi-polar transistor 11' having a base control electrode and collector and emitter output electrodes. All other circuit connections and components are identical to those in FIG. 1 and have been designated by corresponding prime reference numeral designations. For the circuit 10' the maximum voltage at the terminal 15' is now approximately equal to the magnitude of the resistor 16' times the current of the current source 18' plus the base-emitter threshold voltage of the transistor 11'.

Figure 3:
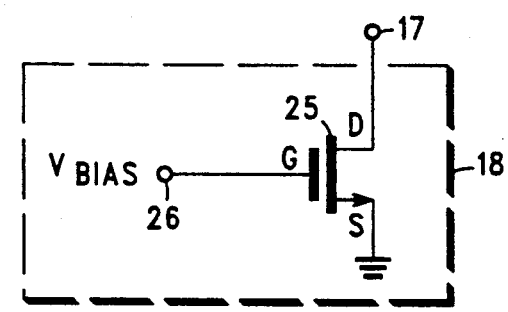
FIG. 3 is a schematic diagram of one of the components in the embodiments shown in FIGS. 1 and 2.

Referring to FIG. 3, a detailed schematic of a preferred embodiment for the constant current source 18 is illustrated. The constant current source comprises an FET transistor 25 having its source electrode connected to ground and its drain electrode connected to the terminal 17. A gate electrode of this transistor is connected to a terminal 26 at which a controllable bias voltage $V_{Bias}$ is provided. In FIG. 3, the FET transistor 25 is a saturated transistor whose current conduction between its drain and source terminals is determined by the magnitude of the bias voltage provided at the terminal 26. Preferably this bias voltage is provided by the control circuit 21 wherein the control circuit can, if desired, alter this bias voltage and therefore alter the known current provided by the constant current source 18. Thus the control circuit 21 can adjust the maximum voltage permitted at the terminal 15.

A significant feature of the present invention is that its readily permits adjustment of an effective zener diode voltage which is the limit for the voltage which can be provided at the terminal 15. This is because this voltage is a function of the magnitude of the resistor 16 and the current provided by the constant current source 18. An infinitely adjustable effective zener voltage can be achieved using the present invention rather than using only one of the several discrete value zener diode voltages which are realizable using conventional semiconductor manufacturing technology. Another significant advantage of the present invention is that it minimizes the number of components external to the integrated circuit 22 to accomplish a zener diode regulating function for the voltage at the terminal 15 while eliminating the use of a zener diode whose regulation voltage generally has a wide tolerance. In the present invention, the operation of a zener diode and a single or pair of resistors is readily replaced by a constant current source and a resistor. Since the constant current source is preferably provided as part of an integrated circuit it represents substantially no additional cost to the cost of the integrated circuit. The providing of the resistor 16 external to the integrated circuit provides a convenient way of externally adjusting or selecting the regulation voltage for the voltage at the terminal 15 if such adjustment or selection is necessary. The effective zener diode regulation achieved by the present invention can be accomplished by utilizing only a single component external to the integrated circuit 22.

Figure 4:
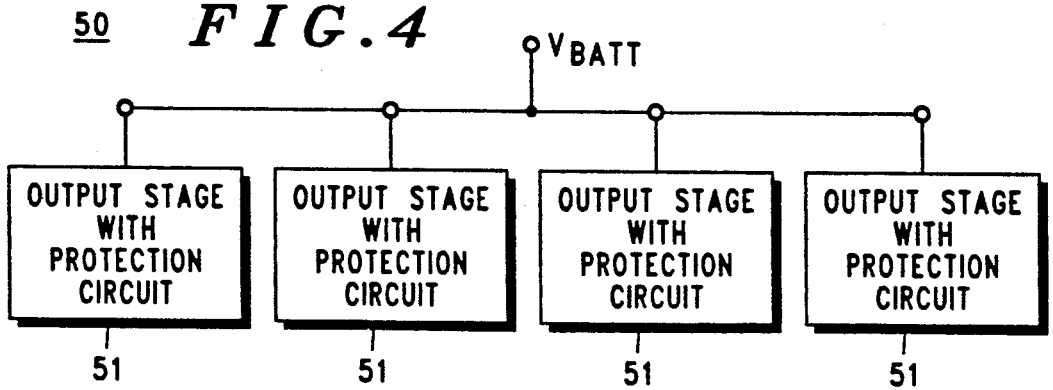
FIG. 4 is a schematic diagram of an overvoltage protection system using the present invention.

The present invention can be used to independently adjust the flyback voltage limits of each of a plurality of fuel injector solenoids so that all of them have the same deactivation time. This provides more uniform fuel injection operation. FIG. 4 shows a system 50 which uses a plurality of output stages 51 with protection circuits, each output stage identical to the circuit 10 in FIG. 1, to independently adjust the flyback voltages for a plurality of fuel injection solenoids. Also, the components 11, 16 and 18, by themselves, form a programmable or adjustable/selectable zener diode which can be used for any voltage limiting application, not just for limiting inductive flyback voltages.

While we have described specific embodiments of the present invention, further embodiments and improvements will occur to those skilled in the art. All such variations which retain the basic concepts disclosed and claimed herein are within the scope of this invention.

We claim:

1. An overvoltage protection circuit comprising:
   switch means having a control electrode for receiving a control signal voltage and first and second output electrodes, said switch means being turned on and thereby permitting current conduction between said output electrodes in response to the control signal voltage at said control electrode exceeding a predetermined threshold voltage with respect to said first output electrode;
   a terminal having a variable voltage signal provided thereat wherein said terminal is coupled to said second output electrode of said switch means;
   a resistor coupled between said terminal and said control electrode of said switch means; and
   a constant current source connected to said control electrode and providing a known current;
   wherein for voltages at said terminal above a predetermined maximum voltage said resistor provides current to said control electrode in accordance with the magnitude of the voltage at said terminal which current will exceed the known current provided by said constant current source by a predetermined amount, and said switch means will, in response thereto, be turned on and permit current conduction between its output electrodes thereby tending to limit the magnitude of the voltage at said terminal and said second output electrode of said switch means.

2. An overvoltage protection circuit according to claim 1 wherein said terminal is DC coupled to said second output electrode of said switch means.

3. An overvoltage protection circuit according to claim 2 wherein a load is connected between a source of DC power supply voltage and said second output electrode of said switch means, said switch means controlling current conduction from said DC power supply voltage source through said load.

4. An overvoltage protection circuit according to claim 3 which includes control circuit means for providing an external switch control signal to said control electrode, in addition to any signals provided by said resistor and said constant current source, to control conduction of said switch means in accordance with said external switch control signal.

5. An overvoltage protection circuit according to claim 4 wherein said external switch control signal provided by said control circuit means varies between an open circuit high impedance state corresponding to a desired off condition for said switch means and another state during which bias is provided to said control electrode to turn said switch means on.

6. An overvoltage protection circuit according to claim 4 wherein said load comprises an inductive load and wherein said resistor and constant current source together determine the maximum voltage which can be provided at said second electrode of said switch means prior to said resistor providing sufficient current to said control electrode to turn on said switch means.

7. An overvoltage protection circuit according to claim 6 wherein said first output electrode is coupled to a fixed reference voltage other than the DC power supply voltage connected via said load to said second output electrode of said switch means.

8. An overvoltage protection circuit according to claim 7 wherein said fixed reference voltage coupled to said first output electrode is ground potential.

9. An overvoltage protection circuit according to claim 1 wherein at least one of said resistor and constant current source are adjustable to adjust said maximum voltage which can be provided at said terminal prior to said resistor providing a sufficient current from said terminal to said control electrode to turn on said switch means.

10. An overvoltage protection circuit according to claim 1 which includes a fuel injector inductive coil connected as a load between a source of DC power supply voltage and said terminal and wherein said terminal and said second output electrode of said switch means are directly connected to and correspond to each other.

11. An overvoltage protection circuit according to claim 10 wherein said switch means comprises a transistor.

12. An overvoltage protection circuit according to claim 11 wherein said transistor is a bi-polar transistor and said control electrode corresponds to a base electrode of said transistor.

13. An overvoltage protection circuit according to claim 11 wherein said transistor is a field effect transistor (FET) and said control electrode corresponds to a gate electrode of said transistor.

14. An overvoltage protection circuit according to claim 2 wherein said predetermined maximum voltage is greater than said predetermined threshold voltage.

15. An overvoltage protection circuit according to claim 2 wherein said constant current source is part of an integrated circuit.

16. An overvoltage protection circuit according to claim 15 wherein said switch means and said resistor are external to said integrated circuit.

17. An overvoltage protection circuit according to claim 2 wherein said constant current source has an input terminal for receiving a bias voltage the magnitude of which determines said known current provided by said constant current source.

18. An overvoltage protection circuit according to claim 17 wherein said bias voltage is adjustable.

19. An overvoltage protection circuit comprising:
   transistor switch means having a control electrode for receiving a control signal voltage and first and second output electrodes, said switch means being turned on and thereby permitting current conduction between said output electrodes in response to the control signal voltage at said control electrode exceeding a predetermined threshold voltage with respect to said first output electrode;

a terminal having a variable voltage signal provided thereat wherein said terminal is coupled to said second output electrode of said switch means;

a resistor coupled between said terminal and said control electrode of said switch means; and a constant current source connected to said control electrode and providing a known current;

wherein for voltages at said terminal above a predetermined maximum voltage said resistor provides current to said control electrode in accordance with the magnitude of the voltage at said terminal which current will exceed the known current provided by said constant current source by a predetermined amount, and said switch means will, in response thereto, be turned on and permit current conduction between its output electrodes thereby tending to limit the magnitude of the voltage at said terminal and said second output electrode of said switch means;

wherein said terminal is DC coupled to said second output electrode of said switch means, wherein an inductive load is connected as a load between a source of DC power supply voltage and said terminal, and wherein said overvoltage protection circuit includes control circuit means for providing an external switch control signal to said control electrode, in addition to any signals provided by said resistor and said constant current source, to control conduction of said switch means in accordance with said external switch control signal.

20. An overvoltage protection circuit according to claim 19 wherein said constant current source and said control circuit means are part of an integrated circuit and wherein said control circuit means controls current through said load via said transistor switch means.

21. An overvoltage protection system comprising:

a plurality of output stages each providing electrical excitation to a different load associated with each stage, a plurality of overvoltage protection circuits each associated with one of said plurality of output stages, each of said protection circuits being independently adjustable to provide each stage with an adjustable maximum voltage that can be provided in each stage, said protection circuits being adjusted such that each of said stages provides electrical excitation to its associated load in a substantially identical manner in accordance with a predetermined criteria.

22. An overvoltage protection system according to claim 21 wherein said loads are inductive loads and said maximum voltages adjusted by said overvoltage protection circuits are flyback voltages provided by said loads when current through a load is reduced by its associated output stage.

23. An overvoltage protection system according to claim 22 wherein said loads are fuel injector soleniods.

24. An overvoltage protection system according to claim 23 wherein said protection circuits are adjusted such that all of said fuel injection solenoids have independently adjustable maximum flyback voltages such that all of the solenoids have similar deactivation times.

25. An overvoltage protection system according to claim 24 wherein each of said protection circuits includes the following structure:

switch means having a control electrode for receiving a control signal voltage and first and second output electrodes, said switch means being turned on and thereby permitting current conduction between said output electrodes in response to the control signal voltage at said control electrode exceeding a predetermined threshold voltage with respect to said first output electrode;

a terminal having a variable voltage signal provided thereat wherein said terminal is coupled to said second output electrode of said switch means;

a resistor coupled between said terminal and said control electrode of said switch means; and a constant current source connected to said control electrode and providing a known current;

wherein for voltages at said terminal above a predetermined maximum voltage said resistor provides current to said control electrode in accordance with the magnitude of the voltage at said terminal which current will exceed the known current provided by said constant current source by a predetermined amount, and said switch means will, in response thereto, be turned on and permit current conduction between its output electrodes thereby tending to limit the magnitude of the voltage at said terminal and said second output electrode of said switch means.

26. An overvoltage protection system according to claim 25 wherein in each of said protection circuits said terminal is DC coupled to said second output electrode of said switch means.

27. An overvoltage protection system according to claim 21 wherein each of said protection circuits includes the following structure:

switch means having a control electrode for receiving a control signal voltage and first and second output electrodes, said switch means being turned on and thereby permitting current conduction between said output electrodes in response to the control signal voltage at said control electrode exceeding a predetermined threshold voltage with respect to said first output electrode;

a terminal having a variable voltage signal provided thereat wherein said terminal is coupled to said second output electrode of said switch means;

a resistor coupled between said terminal and said control electrode of said switch means; and a constant current source connected to said control electrode and providing a known current;

wherein for voltages at said terminal above a predetermined maximum voltage said resistor provides current to said control electrode in accordance with the magnitude of the voltage at said terminal which current will exceed the known current provided by said constant current source by a predetermined amount, and said switch means will, in response thereto, be turned on and permit current conduction between its output electrodes thereby tending to limit the magnitude of the voltage at said terminal and said second output electrode of said switch means.

28. An overvoltage protection system according to claim 27 wherein in each of said protection circuits said terminal is DC coupled to said second output electrode of said switch means.

* * * * *